(12) United States Patent
Kim

(10) Patent No.: US 7,728,670 B1
(45) Date of Patent: Jun. 1, 2010

(54) METHOD AND APPARATUS FOR AN AMPLIFIER

(75) Inventor: Chun-Sup Kim, San Jose, CA (US)

(73) Assignee: Ikanos Communications, Inc., Fremont, CA (US)

( * ) Notice: Subject to any disclaimer, the term of this patent is extended or adjusted under 35 U.S.C. 154(b) by 0 days.

(21) Appl. No.: 12/006,141

(22) Filed: Dec. 31, 2007

Related U.S. Application Data

(60) Provisional application No. 60/877,954, filed on Dec. 30, 2006.

(51) Int. Cl.
*H03F 3/18* (2006.01)
(52) U.S. Cl. .................................. 330/263; 330/267
(58) Field of Classification Search ............... 330/263, 330/267–268, 273–274
See application file for complete search history.

(56) References Cited

U.S. PATENT DOCUMENTS

| | | |
|---|---|---|
| 6,166,603 A | 12/2000 | Smith |
| 6,657,496 B2 * | 12/2003 | Chen et al. .................. 330/263 |
| 7,088,182 B2 | 8/2006 | Ivanov |
| 7,253,685 B2 | 8/2007 | Chung |
| 7,298,211 B2 | 11/2007 | Akama |

* cited by examiner

*Primary Examiner*—Robert Pascal
*Assistant Examiner*—Hieu P Nguyen
(74) *Attorney, Agent, or Firm*—IP Creators; Charles C Cary

(57) ABSTRACT

An amplifier including complementary push and pull components, a bias component and a quiescent current balancer. The complementary push and pull components are serially coupled to one another between an electrical source and sink to generate an output signal at a common output terminal responsive to the input signal source. The bias component is coupled between the input signal source and the complementary push-pull components to bias the input signal to the push component and the input signal to the pull component by discrete amounts which reduce cross-over clipping exhibited in the output signal. The quiescent current balancer is coupled to the output terminal to balance quiescent currents in the push and the pull component at discrete levels which equilibrate amplification levels of the input signal generated by the push component and the pull component in the output signal at the output terminal.

15 Claims, 6 Drawing Sheets

METHOD AND APPARATUS FOR AN AMPLIFIER

CROSS REFERENCE TO RELATED APPLICATION

This application claims the benefit of prior filed co-pending Provisional Application No. 60/877,954 filed on Dec. 30, 2006 entitled "Output Stage Circuit with Boosted Linearity" which is incorporated herein by reference in its entirety as if fully set forth herein.

BACKGROUND OF THE INVENTION

1. Field of Invention

The present invention is generally related to amplifiers and more particularly to amplifiers of a push-pull type.

2. Description of the Related Art

An amplifier modulates current from a power supply responsive to an input signal. Amplifiers are divided into classes based on the circuit basics by which the modulation of the power supply is achieved.

A class "A" amplifier utilizes one or more devices each of which operate over the whole input signal cycle to deliver the amplified output signal. The Class "A" amplifier is characterized by relatively low clipping and relatively high power consumption. Relatively high power consumption is a result of the "always on" characteristic of the devices which form the Class "A" amplifier in which power consumption is essentially constant whether or not there is an input signal.

The Class "B" amplifier provides a more power efficient alternative in which complementary push and pull devices operate in anti-phase with one another on opposite halves of the input signal to deliver complementary positive going and negative going amplified portions of the output signal. During the positive going portion of the input signal the push device(s) source current to the output from a positive power supply. During the negative going portion of the input signal the pull device(s) sink current from the output to a negative power supply. The most noticeable price associated with the reduced power consumption of this Class of amplifiers is cross-over distortion or cross-over clipping. This results in the input signal region proximate the common mode or cross-over voltage at which both the push as well as the pull device(s) are in the "Off" state and thus unresponsive to the input signal.

The Class "AB" amplifier reduces the extreme cross-over distortion of the pure Class "B" architecture by biasing each into an "never off" state thereby reducing the efficiency of the amplifier. Both the push and pull devices are provided with input signal biasing to prevent their entry into the "Off" state. The Class "AB" design thus blends the characteristics of the Class "A" and Class "B" designs. This composite design reduces cross-over clipping of the pure Class "B" design at the expense of an increased power consumption associated with the pure Class "A" design. This increased power consumption arises from what is known as the 'quiescent' or 'bias' current which flows from positive to negative power supply through both the push and pull devices constantly even in the absence of an input signal. The Class "AB" architecture is attractive because only small amounts of quiescent/bias current are required to greatly reduce cross-over distortion. Thus this composite design does not for practical purposes have to take on the extreme power consumption associated with the pure Class "A" design.

Typical Class "AB" amplifiers utilize complementary transistor architectures, i.e. "npn" and "pnp" architectures, a.k.a. "N" and "P" type devices respectively. In a bipolar junction transistor (BJT) the three letters refer to the semiconductor material and hence majority charge carrier from which each region of the BJT, i.e. the emitter, base, and collector are made. Similarly in a field effect transistor the three letters refer to the semiconductor material and majority charge carrier from which the drain, substrate, and source are made. The "N" and "P" types are said to be complementary in that their switching characteristics are complementary. The "P" type device, a.k.a. "pnp" type device is generally "On" and conducting when the control input, i.e. the base of a BJT or the gate of a FET is pulled low. Conversely, the "N" type device, a.k.a. "npn" type device is generally "On" and conducting when the control input, i.e. the base of a BJT or the gate of a FET is pulled high.

The designer of a Class "AB" amplifier is faced inherent performance differences when designing a push-pull type amplifier. The most basic of these performance differences arises from the fact that holes have a much lower mobility than electrons. Thus "N" type devices, relying as they do on electrons as the current limiting charge carriers, generally have higher current carrying, gain and frequency characteristics than "P" type devices. These differences in mobility and other differences in device architecture between "P" and "N" type devices make it difficult to minimize distortion across the full operating range of the amplifier.

What is needed is an amplifier architecture which allows for reduced distortion and power consumption.

SUMMARY OF THE INVENTION

A method and apparatus is disclosed for reducing the distortion associated with push-pull amplifiers. In addition to biasing the quiescent current levels of the push and pull elements a balancer provides the ability to balance quiescent current levels between the push and pull elements to reduce the distortion resulting from differences in frequency response and gain between the complementary transistor(s) types which form the push and pull elements.

In an embodiment of the invention an amplifier for amplifying an input signal from an input signal source is disclosed. The amplifier includes: complementary push and pull components, a bias component and a quiescent current balancer. The complementary push and pull components are serially coupled to one another between an electrical source and sink to generate an output signal at a common output terminal there between responsive to the input signal source. The bias component is coupled between the input signal source and the complementary push-pull components to bias the input signal to the push component and the input signal to the pull component by discrete amounts which reduce cross-over clipping exhibited in the output signal at the output terminal. The quiescent current balancer is coupled to the output terminal of the complementary push and pull components to balance quiescent currents in the push and the pull component at discrete levels which equilibrate amplification levels of the input signal generated by the push component and the pull component in the output signal at the output terminal.

In an alternate embodiment of the invention a method for amplifying an input signal from an input signal source is disclosed. The method comprises the acts of:

pushing current from an electrical source to an output terminal responsive to a first phase of the input signal to generate a corresponding portion of the output signal at the output terminal;

pulling current to an electrical sink from the output terminal responsive to a second phase of the input signal substantially complementary to the first phase to generate a remaining corresponding portion of the output signal;

biasing the input signal to the pulling act and the input signal to the pushing act by discrete amounts which reduce cross-over clipping exhibited in the output signal at the output terminal; and balancing quiescent currents in the pushing act and the pulling act at discrete levels which equilibrate amplification levels of the input signal generated by the pushing act and the pulling act in the output signal at the output terminal.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

A method and apparatus is disclosed for reducing the distortion associated with push-pull amplifiers. In addition to biasing the quiescent current levels of the push and pull elements a balancer provides the ability to balance quiescent current levels between the push and pull elements to reduce the distortion resulting from differences in frequency response and gain between the complementary transistor(s) types which form the push and pull elements.

Figure 1A:
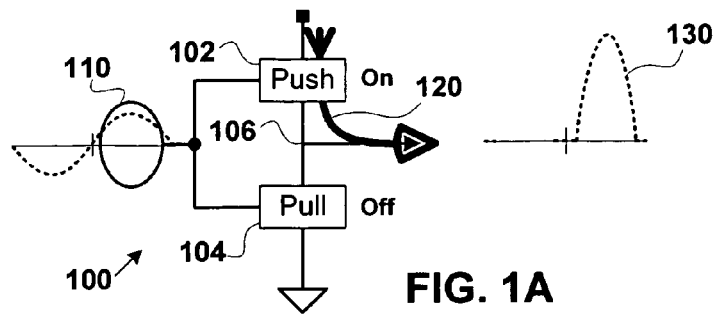
FIGS. 1A-1C are combined hardware block and signal diagrams showing current flow during operation of a prior art push-pull amplifier.
Figure 1B:
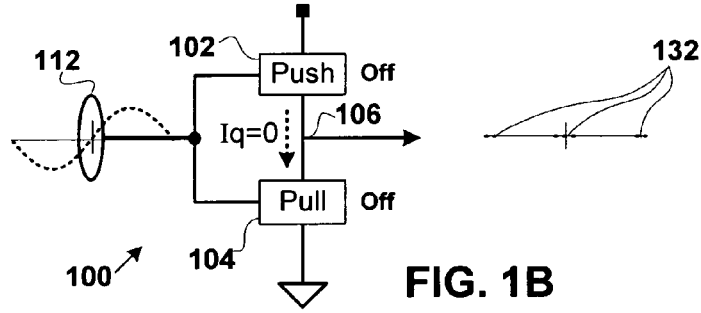
Figure 1C:
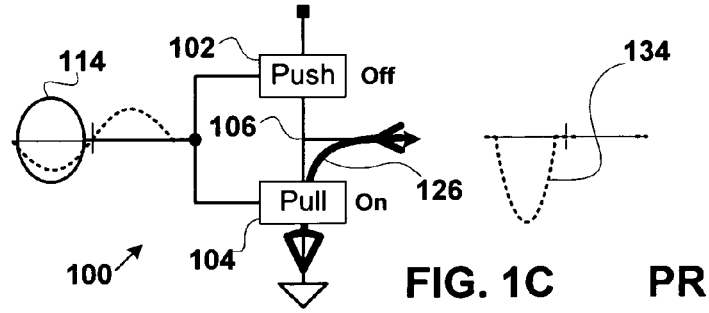

FIGS. 1A-1C are combined hardware block and signal diagrams showing current flow during operation of a prior art Class "B" push-pull amplifier 100. The push-pull to amplifier includes a push component 102 and a pull component 104 serially coupled to one another between a current source and sink to provide an output signal at a common output terminal 106. The push and pull components typically include complementary "N" and "P" transistor types. Typically the transistors bases or gates in the context of bipolar junction transistors (BJT) and field effect transistors (FET) respectively are driven directly by the input signal. Alternately, some form of capacitive coupling may be used to remove the DC component of the input signal used to drive the transistor bases or gates. In the example shown the push component would include an "N" channel device and the pull component would include a "P" channel device, resulting in a non-inverted relationship between the input and output signals. Alternately an inverting relationship between the input and output signals would result from an architecture in which the push component and pull components relied on the opposite transistor types.

FIG. 1A shows an operational phase in which the positive going portion 110 of the input signal activates the push component 102 thereby pushing proportionate amounts of current 120 from a positive voltage supply onto the output terminal 106 to generate the resultant portion 130 of the output signal. The push component is only switched on over less than 180 degrees of the input signal.

FIG. 1B shows an operational phase proximate the center voltage, a.k.a. common mode voltage point 112 of the input signal. In this Class "B" amplifier example the common mode voltage portion 112 of the input signal is too low in voltage to activate the "N" type transistor in the push component 102 and to high in voltage to activate the "P" type transistor in the pull component 104. During this "Off" phase of both the push and the pull components no quiescent current passes across the output terminal 106, i.e. Iq=0 mA. The resultant portion 132 of the output signal comprises the flat line common voltage associated with the undesirable cross-over clipping endemic to the pure Class "B" amplifier.

FIG. 1C shows an operational phase in which the negative going portion 114 of the input signal activates the pull component thereby pulling proportionate amounts of current 126 to the negative voltage supply from the output terminal 106 to generate the resultant portion 134 of the output signal. The pull component operates in anti-phase with the push component and is only switched on over less than 180 degrees of the input signal.

Figure 1D:
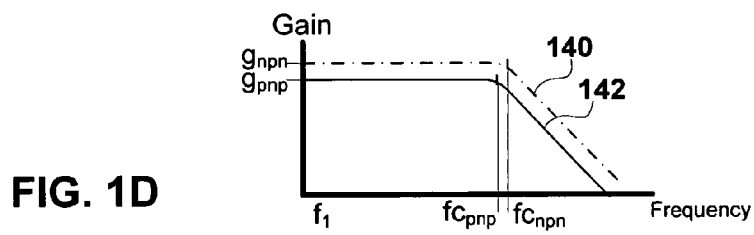
FIG. 1D is a graph showing gain versus frequency characteristics for the prior art push-pull amplifier shown in FIGS. 1A-1C.

FIG. 1D is a graph showing gain versus frequency characteristics for the prior art push-pull amplifier shown in FIGS. 1A-1C. The discrete "N" and "P" type transistor channel gain vs. frequency characteristics are shown with dotted line 140 and solid line 142 respectively. The "N" type transistor typically has higher gain $g_{npn}$ and corner frequency $fc_{npn}$ than the gain $g_{pnp}$ and corner frequency $fc_{pnp}$ of the "P" type transistor.

Figure 1E:
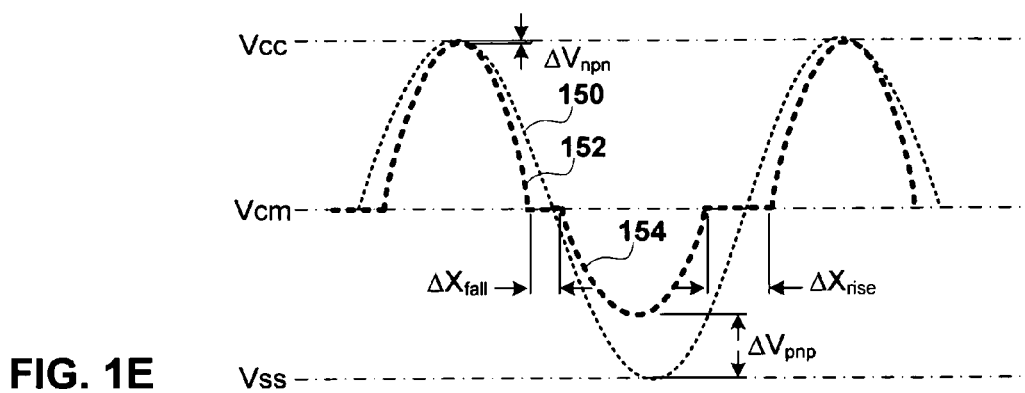
FIG. 1E is a graph showing an actual versus an ideal output signal characteristics for the prior art push-pull amplifier shown in FIGS. 1A-1C.

FIG. 1E is a graph showing an actual 152, 154 versus an ideal 150 output signal characteristics for the prior art push-pull amplifier shown in FIGS. 1A-1C. The ideal signal 150 is symmetrical in gain about the center frequency Vcm and exhibits no cross-over clipping. The actual signal exhibits cross-over clipping corresponding with the inactive region shown in FIG. 1B. Furthermore the shoulder associated with cross-over clipping $\Delta X_{fall}$ on a falling slope is asymmetrical with respect to the shoulder associated with cross-over clipping $\Delta X_{rise}$ on a rising slope. Additional distortion is exhibited in the asymmetrical gain characteristics on the discrete portions of the output signal 152, 154 generated by the push and pull components respectively. The portion 152 of the output signal generated by the push component 102 exhibits higher gain and closer proximity $\Delta V_{npn}$ to the positive supply voltage than the gain effected by the pull component 104 and the proximity $\Delta V_{pnp}$ of the corresponding portion 154 of the output signal to the negative supply voltage.

Figure 2A:
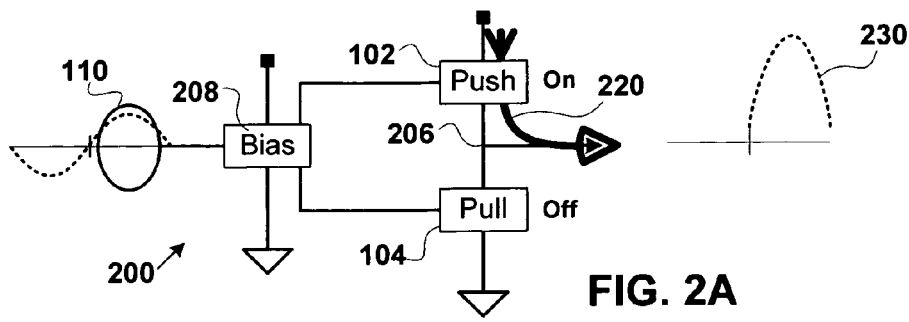
FIGS. 2A-2C are combined hardware block and signal diagrams showing current flow during operation of a prior art push-pull amplifier with quiescent current biasing.
Figure 2B:
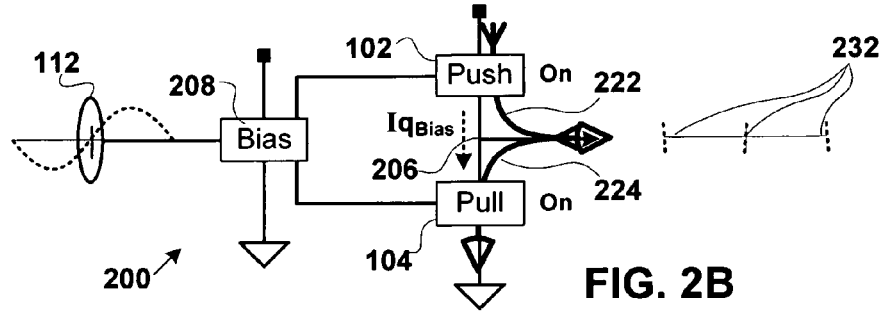
Figure 2C:
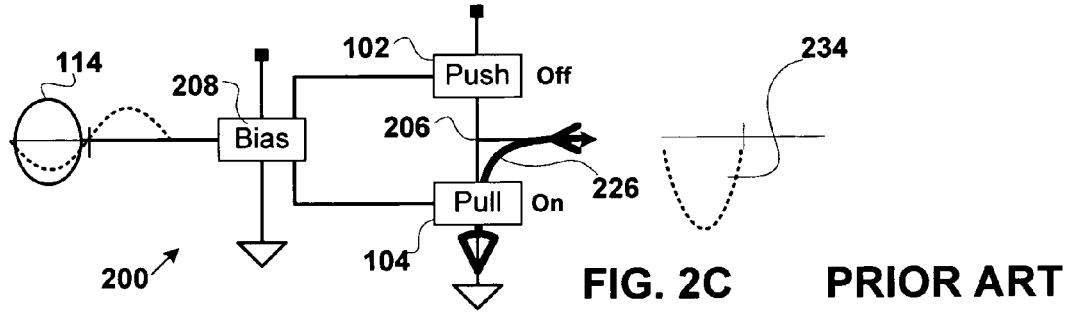

FIGS. 2A-2C are combined hardware block and signal diagrams showing current flow during operation of a prior art push-pull amplifier with quiescent current biasing. Quiescent current biasing reduces cross-over distortion by forcing the pure Class "B" device into a hybrid behavior incorporating 'always on' features of a Class "A" amplifier hence warranting the Class "AB" moniker for the resultant device. Biasing results in a quiescent current in the push and pull components, which are thus never "Off" even when the input signal is quiet or idle. At a circuit level biasing is achieved by shifting the input signal into two discrete voltage ranges and by applying the resultant biased input signals to a corresponding one of the push and the pull component, so as to prevent the full "Off" state in either component at the center or common mode voltage. This biasing reduces cross-over distortion as shown in the following FIGS. 2A-2E by virtue of an increase in power consumption, resulting from the quiescent current flowing through the push and pull components even when the input signal is quiet or idle.

FIGS. 2A-2C show the biasing device 208 coupled between the input signal and the push and pull components 102, 104. The biasing component shifts the center voltage of the input signal by discrete amounts to drive the corresponding one of the push and the pull component.

FIG. 2A shows an operational phase in which the positive going portion 110 of the biased input signal activates primarily the push component 102 thereby pushing proportionate amounts of current 220 from a positive voltage supply onto the output terminal 206 to generate the resultant portion 230 of the output signal. The biasing of the input signal results in the push component only draws significant current over approximately 180 degrees of the input signal and currents approaching the quiescent current level during remaining portions of the input signal cycle.

FIG. 2B shows an operational phase proximate the center voltage, a.k.a. common mode voltage point 112 of the input signal. In this Class "AB" amplifier example the minimum voltage of the biased input signal to the push component is up biased so as to never drive the push component to the full off state. Similarly the maximum voltage for the pull component is down biased so as to never drive the pull component to the full off state. Thus at the center voltage or common mode voltage the quiescent current flows through the pull component from the push component, i.e. $Iq_{bias} > 0$ mA. As the input signal moves toward or away from the common mode voltage proportionate amounts of current 222, 224 flow from the corresponding push and pull component to generate the resultant sloped portions 232 of the output signal which characterizes the Class "AB" amplifier.

FIG. 2C shows an operational phase in which the negative going portion 114 of the biased input signal activates primarily the pull component thereby pulling proportionate amounts of current 226 to the negative voltage supply from the output terminal 206 to generate the resultant portion 134 of the output signal. The biasing of the input signal results in the pull component only drawing significant current over approximately 180 degrees of the input signal anti-phase to that of the pull component and at currents approaching the quiescent current level during remaining portions of the input signal cycle.

Figure 2D:
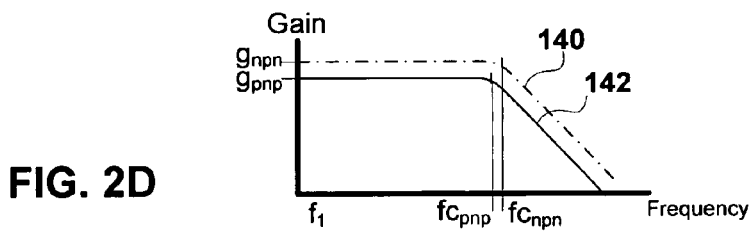
FIG. 2D is a graph showing gain versus frequency characteristics for the prior art push-pull amplifier shown in FIGS. 2A-2C.

FIG. 2D is a graph showing gain versus frequency characteristics for the prior art biased push-pull amplifier shown in FIGS. 2A-2C. The discrete "N" and "P" type transistor gain vs. frequency characteristics are shown with dotted line 140 and solid line 142 respectively. The "N" type transistor typically has higher gain $g_{npn}$ and corner frequency $fc_{npn}$ than the gain $g_{pnp}$ and corner frequency $fc_{pnp}$ of the "P" type transistor.

Figure 2E:
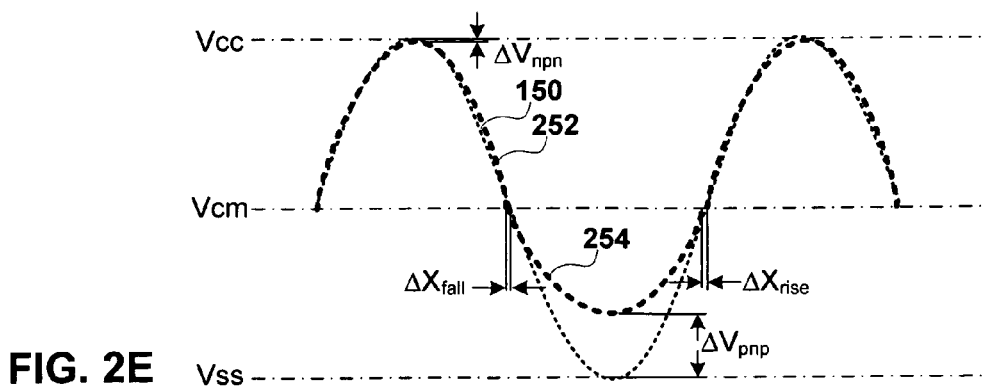
FIG. 2E is a graph showing an actual versus an ideal output signal characteristics for the prior art push-pull amplifier shown in FIGS. 2A-2C.

FIG. 2E is a graph showing an actual 252, 254 versus an ideal 150 output signal characteristics for the prior art biased push-pull amplifier shown in FIGS. 2A-2C. The ideal signal 150 is symmetrical in gain about the center frequency Vcm and exhibits no cross-over clipping. The actual signal as a result of biasing, exhibits very little cross-over clipping compared to the pure Class "B" amplifier shown in FIGS. 1A-1C. The shoulders associated with cross-over clipping $\Delta X_{fall}$ on a falling slope and $\Delta X_{rise}$ on a rising slope are significantly reduced. However, the distortion exhibited in the asymmetrical gain characteristics on the discrete portions of the output signal 252, 254 generated by the push and pull components still remains even after biasing. The portion 252 of the output signal generated by the push component 102 exhibits higher gain and closer proximity $\Delta V_{npn}$ to the positive supply voltage than the gain effected by the pull component 104 and the proximity $\Delta V_{pnp}$ of the corresponding portion 154 of the output signal to the negative supply voltage.

Figure 3A:
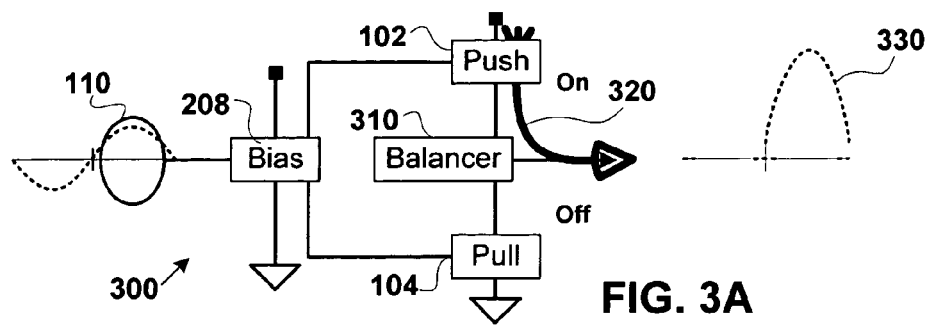
FIGS. 3A-3C are combined hardware block and signal diagrams showing current flow during operation of an embodiment of the push-pull amplifier of the current invention with quiescent current biasing and quiescent current balancing.
Figure 3B:
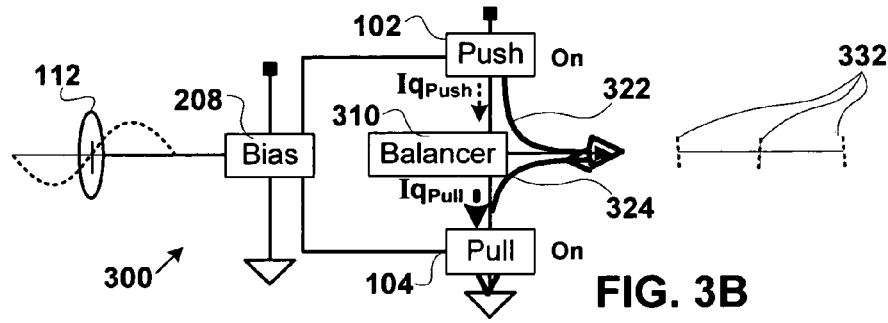
Figure 3C:
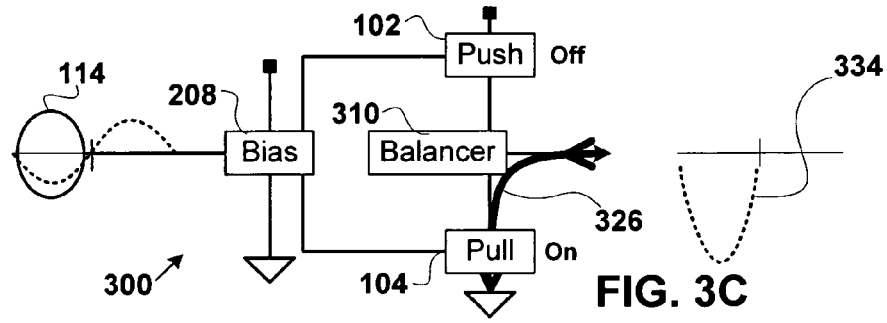

The embodiment of the invention shown in FIGS. 3A-3C provides current balancing to the classic Class "AB" amplifier shown in FIGS. 2A-2C. Whereas biasing establishes a quiescent current level common to both the push and the pull component, balancing allows the quiescent current in the push and the pull component to be set at discrete levels with respect to one another to offset the different gain vs. frequency characteristics of the complementary transistor types found in the push and pull components.

FIGS. 3A-3C are combined hardware block and signal diagrams showing current flow during operation of an embodiment of the push-pull amplifier of the current invention with quiescent current biasing and quiescent current balancing.

FIG. 3A shows an operational phase in which the positive going portion 110 of the biased input signal activates primarily the push component 102 thereby pushing proportionate amounts of current 320 from a positive voltage supply onto the output terminal to generate the resultant portion 330 of the output signal. The biasing of the input signal results in the push component only drawing significant current over approximately 180 degrees of the input signal and currents approaching the balanced quiescent current level during remaining portions of the input signal cycle.

FIG. 3B shows an operational phase proximate the center voltage, a.k.a. common mode voltage point 112 of the input signal. With the input signal at the common mode voltage level, the quiescent current flows through the pull component and the push component are both non-zero and each distinct from one another at discrete levels $Iq_{Push}$ and $Iq_{Pull}$ determined by the balancer 310. These discrete quiescent current levels are selected to reduce the differences in the frequency dependent gain characteristics of the push component and the pull component from one another. As the input signal moves toward or away from the common mode voltage proportionate amounts of current 322, 324 flow from the corresponding push and pull component to generate the resultant sloped portions 332 of the output signal.

FIG. 3C shows an operational phase in which the negative going portion 114 of the biased input signal activates primarily the pull component thereby pulling proportionate amounts of current 326 to the negative voltage supply from the output terminal to generate the resultant portion 334 of the output signal. The biasing of the input signal results in the pull component only drawing significant current over approximately 180 degrees of the input signal anti-phase to that of the pull component and at currents approaching the balanced quiescent current level during remaining portions of the input signal cycle. The balancing of the pull component's quiescent current level, in the embodiment shown, to a level greater than that of the more efficient pull component equilibrates the frequency vs. gain characteristics of the two anti-phase portions of the amplifier's operation shown in FIGS. 3A and 3C.

Figure 3D:
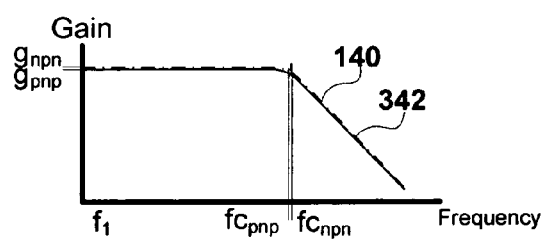
FIG. 3D is a graph showing gain versus frequency characteristics for the embodiment of the push-pull amplifier shown in FIGS. 3A-3C.

FIG. 3D is a graph showing gain versus frequency characteristics for the prior art biased push-pull amplifier shown in FIGS. 3A-3C. The discrete "N" and "P" type transistor gain vs. frequency characteristics are shown with dotted line 140 and solid line 342 respectively. The greater efficiency of the "N" type transistor utilized in this embodiment in the push component 102 has been balanced by the higher quiescent current delivered to the pull component 104 by the balancer 310. This balancing of quiescent currents equilibrates the gain and cutoff frequency in the push and pull components bringing gains $g_{npn}$ and $g_{pnp}$ and corner frequency $fc_{npn}$ and $fc_{pnp}$ into equilibrium.

Figure 3E:
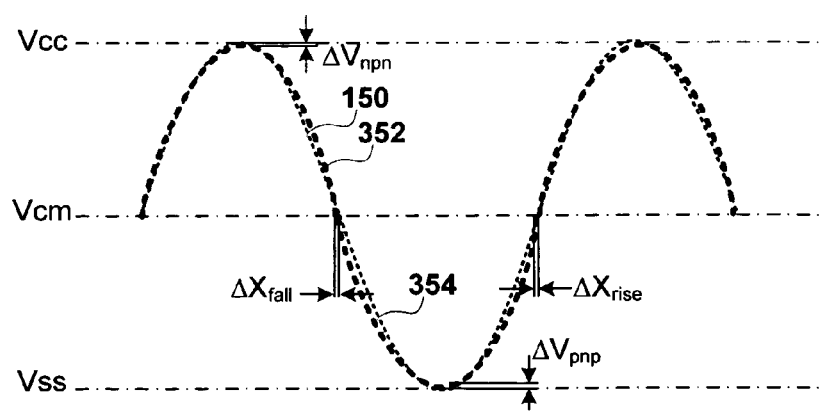
FIG. 3E is a graph showing an actual versus an ideal output signal characteristics for the embodiment of the push-pull amplifier shown in FIGS. 3A-3C.

FIG. 3E is a graph showing an actual 352, 354 versus an ideal 150 output signal characteristics for the balanced push-pull amplifier shown in FIGS. 3A-3C. The ideal signal 150 is symmetrical in gain about the center frequency Vcm and exhibits no cross-over clipping. The actual signal as a result of biasing and balancing, exhibits very little cross-over clipping compared to the pure Class "B" amplifier shown in FIGS. 1A-1C. Even when compared to the Class 'AB' amplifier shown in FIGS. 2A-2C the cross-over clipping has been reduced due to balancing out the frequency related performance characteristics of the push and pull component. Additionally, the distortion attributed to asymmetrical gain characteristics in the push and pull components has been significantly reduced do to quiescent current balancing. The portion 352 of the output signal generated by the push component 102 exhibits equivalent gain and proximity $\Delta V_{npn}$ to the positive supply voltage as does the gain effected by the pull component 104 and the proximity $\Delta V_{pnp}$ of the corresponding portion 354 of the output signal to the negative supply voltage.

Figure 4:
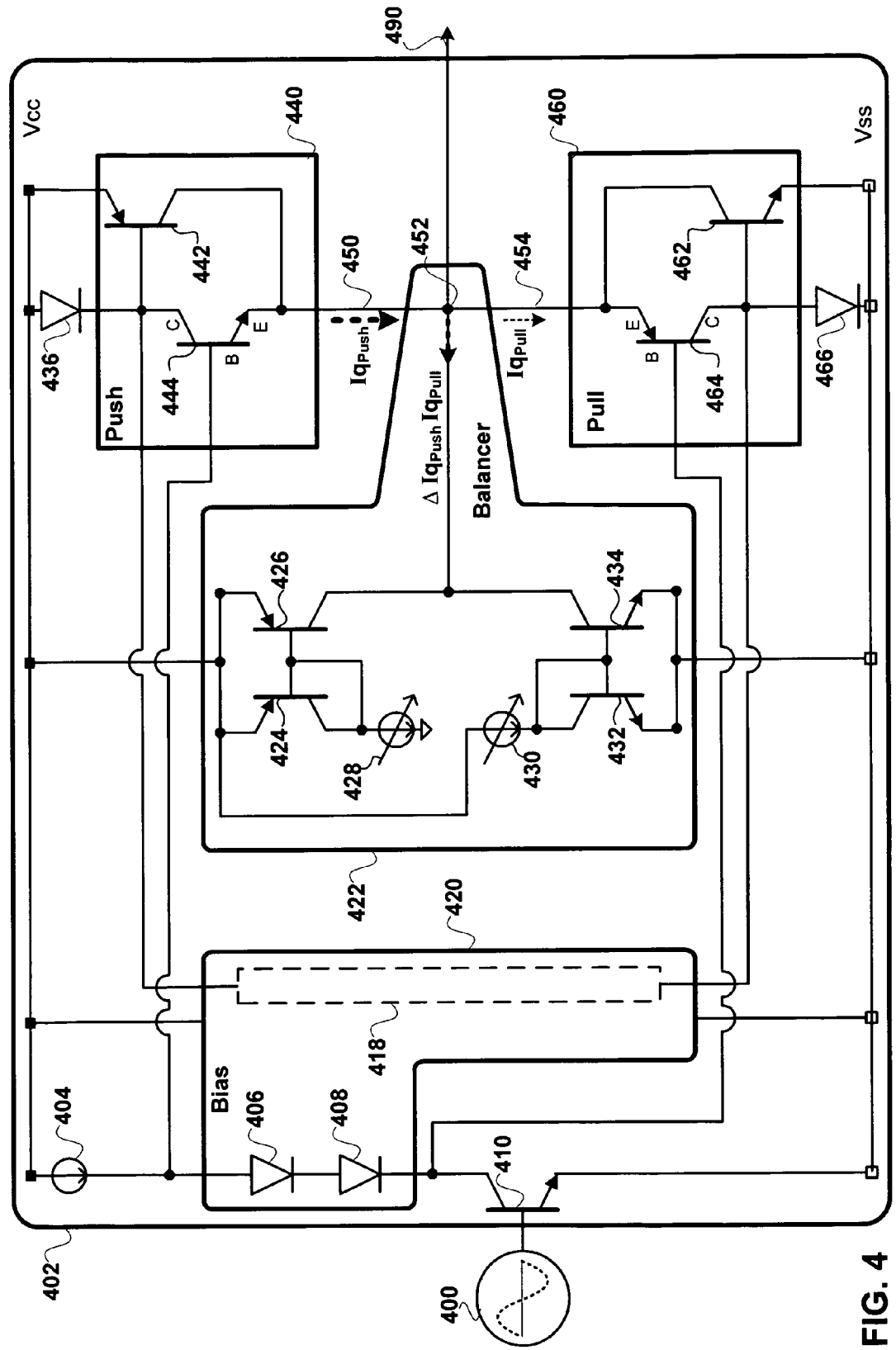
FIG. 4 is a detailed hardware block diagram of an embodiment of the quiescent current balanced push-pull amplifier of the current invention.

FIG. 4 is a detailed hardware block diagram of an embodiment of the quiescent current balanced push-pull amplifier of the current invention. The amplifier 402 includes: a current buffer 410, a bias component 420, a quiescent current balancer 422, a push component 440 and a pull component 460. In this embodiment of the invention the current buffer is an "npn" type BJT with the base directly or capacitively coupled to the input signal source 400, the emitter coupled to lower voltage rail 'Vss' and the collector coupled via the bias component 420 and a current limiter 404 to the upper voltage rail 'Vcc'. Within the bias component two series connected diodes 406-408 provide biasing of the input signal to a first stage of complementary transistors 444 and 464 in the push and pull components respectively. The biasing of the second stage of complementary transistors 442 and 462 in the push and pull components respectively is provided both by the diodes 436 and 466 which couple the push component to 'Vcc' and the pull component to 'Vss' respectively as well as by the optional bias module 418 internal to the bias component 420. The push component includes a first stage 'npn' transistor 444 and a second stage 'pnp' transistor 442 operating as beta squared gain scalers of the biased input signal. The push component's current flow is dominated by the second stage's 'pnp' transistor 442. The pull component includes a first stage 'pnp' transistor 464 and a second stage 'npn' transistor 462 operating as beta squared gain scalers of the biased input signal. The pull component's current flow is dominated by the second stage's 'npn' transistor 462. The biased current established by the bias component 420 is subject to balancing by the balancer to equilibrate the frequency related performance characteristics of the push and pull components. In this embodiment of the invention the second stage bipolar transistors, i.e. "pnp" 442 and "npn" 462 deliver the preponderance of current which drives the output signal 490. Typically the 'npn' transistor, in this case transistor 462 is the more efficient device. The balancer then, in this embodiment of the invention, operates as a current sink at the output terminal 452 to remove a portion of the quiescent current $Iq_{Push}$ 450 delivered by the push component, thereby reducing the quiescent current $Iq_{Pull}$ 454 available to the pull component 460. The balancer thus equilibrates the gain vs. frequency characteristics of the push and the pull components by setting discrete levels of the quiescent currents therein. The quiescent current balancer 422 in this embodiment of the invention comprises a current mirror formed by base coupled BJT "P" type transistors 424-426 and base coupled BJT "N" type transistors 432-434 each coupled to a corresponding programmable current sink 428 and source 430 respectively. In an embodiment of the invention where feedback as to the amount of distortion in the output signal is available, the programmable current sink and source can be adjusted to reduce the amount of distortion in response to changing line conditions.

The amount of current sourced or sinked by the current balancer is determined by requiring the cutoff frequency for both the push and pull components to be equal as shown in the following Equation 1.

$$ft_{push} = ft_{pull} \qquad \text{Equation 1}$$

The cutoff frequency of a bipolar junction transistor (BJT) is a function of the transconductance gm of the discrete transistors therein, the base-emitter capacitance Cje, the collector-base capacitance Cu, and the base transit times τF as shown in the following Equation 2

$$ft = \frac{1}{2\pi\left(\tau F + \frac{Cje}{gm} + \frac{Cu}{gm}\right)} \qquad \text{Equation 2}$$

The base transit time τF is determined according to the following Equation 3 where $W_B$ is the base width and Dn or Dp are the diffusion constant of the minority carrier, i.e. electrons or holes in the base region.

$$\tau F = \frac{W_B^2}{2D_{n \text{ or } p}} \qquad \text{Equation 3}$$

Transconductance gm for a BJT is determined according to the following Equation 4 where Ic is the collector current and where Vt is the quotient of the absolute temperature T times to the Boltzmann constant k all divided by q the charge of an electron.

$$gm = \frac{Ic}{Vt} \qquad \text{Equation 4}$$

Example 1

In this example we consider the case of a Class AB amplifier with biasing and without current balancing and with complementary BJT transistors in the push component and the pull component. We further assume that a quiescent current of 1 mA is established via biasing in both the push and the pull components. The 1 mA bias current in the complementary 'pnp' and 'npn' transistors in the push and pull components respectively generates different cutoff frequencies in the complementary BJT transistors. Specifically the cutoff frequency of the 'npn' transistor in the pull component would exceed that of the 'pnp' transistor in the push component by approximately 0.55 GHz assuming gm=3.85E-2, τF=10 ps, Cje=0.5 pF and Cu=1 pF. Without quiescent current balancing the cutoff frequency for the 'npn' transistor would be 3.25 GHz and the cutoff frequency for the 'pnp' transistor would be 2.70 GHz.

Example 2

In this example we determine what balancing is required in the prior example to equilibrate the frequency cutoff and gain of the push and pull components. Balancing the cutoff frequency according to Equation 1 would require discrete collector currents Ic of 1 mA for the 'npn' device and 1.35 mA for the 'pnp' device. Thus the current balancer in this example would operate as a current sink at the output terminal sinking 0.35 mA of a the balanced quiescent current of 1.35 mA in the 'pnp' transistor of the push component with the resultant remaining 1.00 mA of balanced quiescent current delivered to the more efficient 'npn' transistor in the pull component.

Figure 5:
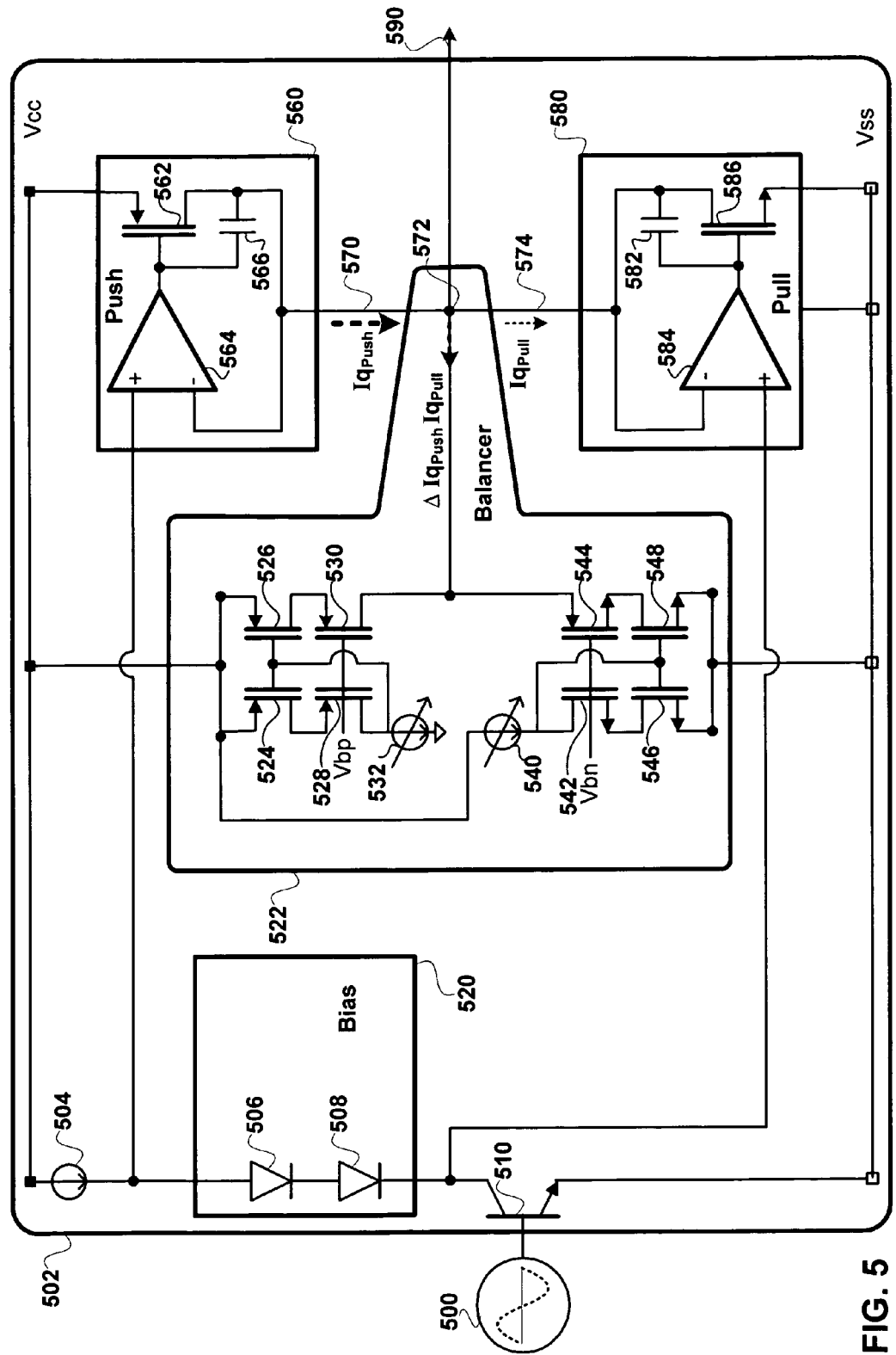
FIG. 5 is a detailed hardware block diagram of an embodiment of the quiescent current balanced push-pull amplifier of the current invention.

FIG. 5 is a detailed hardware block diagram of an alternate embodiment of the quiescent current balanced push-pull amplifier of the current invention. The amplifier 502 includes: a current buffer 510, a bias component 520, a quiescent current balancer 522, a push component 560 and a pull component 580. In this embodiment of the invention the current buffer is an "npn" type BJT with the base directly or capacitatively coupled to the input signal source 500, the emitter coupled to lower voltage rail 'Vss' and the collector coupled via the bias component 520 and a current limiter 504 to the upper voltage rail 'Vcc'. Within the bias component two series connected diodes 506-508 provide biasing of the input signal to first stage op amps 564 and 584 in the push and pull components respectively. The second stage comprises complementary 'pnp' field effect transistor 562 and 'npn' field effect transistor 586 in the push and pull components respectively. The gate of these transistors is coupled to the output of the corresponding op amp. The drains of each of transistors 562 and 582 are coupled to the corresponding voltage rail 'Vcc' and 'Vss' respectively. A feedback loop is provided from the collector of each device to the non-inverting input of the associated op-amp. Each feedback loop is damped by an associated one of capacitors 566 and 582. The push component includes a first stage op-amp 564 and a second stage 'pnp' FET transistor 562 operating gain scalers of the biased input signal. The push component's current flow is dominated by the second stage's 'pnp' transistor 562. The pull component includes a first stage op-amp 584 a second stage 'npn' transistor 586 operating as gain scalers of the biased input signal. The pull component's current flow is dominated by the second stage's 'npn' transistor 586. The biased current established by the bias component 520 is subject to balancing by the balancer to equilibrate the frequency related performance characteristics of the push and pull components. In this embodiment of the invention the second stage transistors, i.e. "pnp" 562 and "npn" 586 deliver the preponderance of current which drives the output signal 590. Typically the 'npn' transistor, in this case transistor 586 is the more efficient device. The balancer then, in this embodiment of the invention, operates as a current sink at the output terminal 572 to remove a portion of the quiescent current $Iq_{Push}$ 570 delivered by the push component, thereby reducing the quiescent current $Iq_{Pull}$ 574 available to the pull component 580. The balancer thus equilibrates the gain vs. frequency characteristics of the push and the pull components by setting discrete levels of the quiescent currents therein. The quiescent current balancer 522 in this embodiment of the invention comprises a current mirror formed by gate coupled FET "P" type transistors 524-526, 528-530 and base coupled FET "N" type transistors 542-544, 546-548 each coupled to a corresponding programmable current sink 532 and source 540 respectively. In an embodiment of the invention where feedback as to the amount of distortion in the output signal is available, the programmable to current sink and source can be adjusted to reduce the amount of distortion in response to changing line conditions.

The amount of current sourced or sinked by the current balancer is determined by requiring the cutoff frequency for both the push and pull components to be equal is again governed by Equation 1. The cutoff frequency of a metal oxide semiconductor field effect transistor (MOSFET) is a function of the transconductance gm of the discrete transistors therein the gate-source capacitance Cgs, the gate-drain capacitance Cgd, the gate-bulk capacitance Cgb as shown in the following Equation 5.

$$ft = \frac{1}{2\pi(Cgs + Cgd + Cgb)} \qquad \text{Equation 5}$$

Transconductance gm for a MOSFET is determined according to the following Equation 6 where Id is the drain current, the mobility u, the oxide Cox, the channel width W and the channel length L.

$$gm = \sqrt{2uCox\frac{W}{L}Id} \qquad \text{Equation 6}$$

Figure 6:
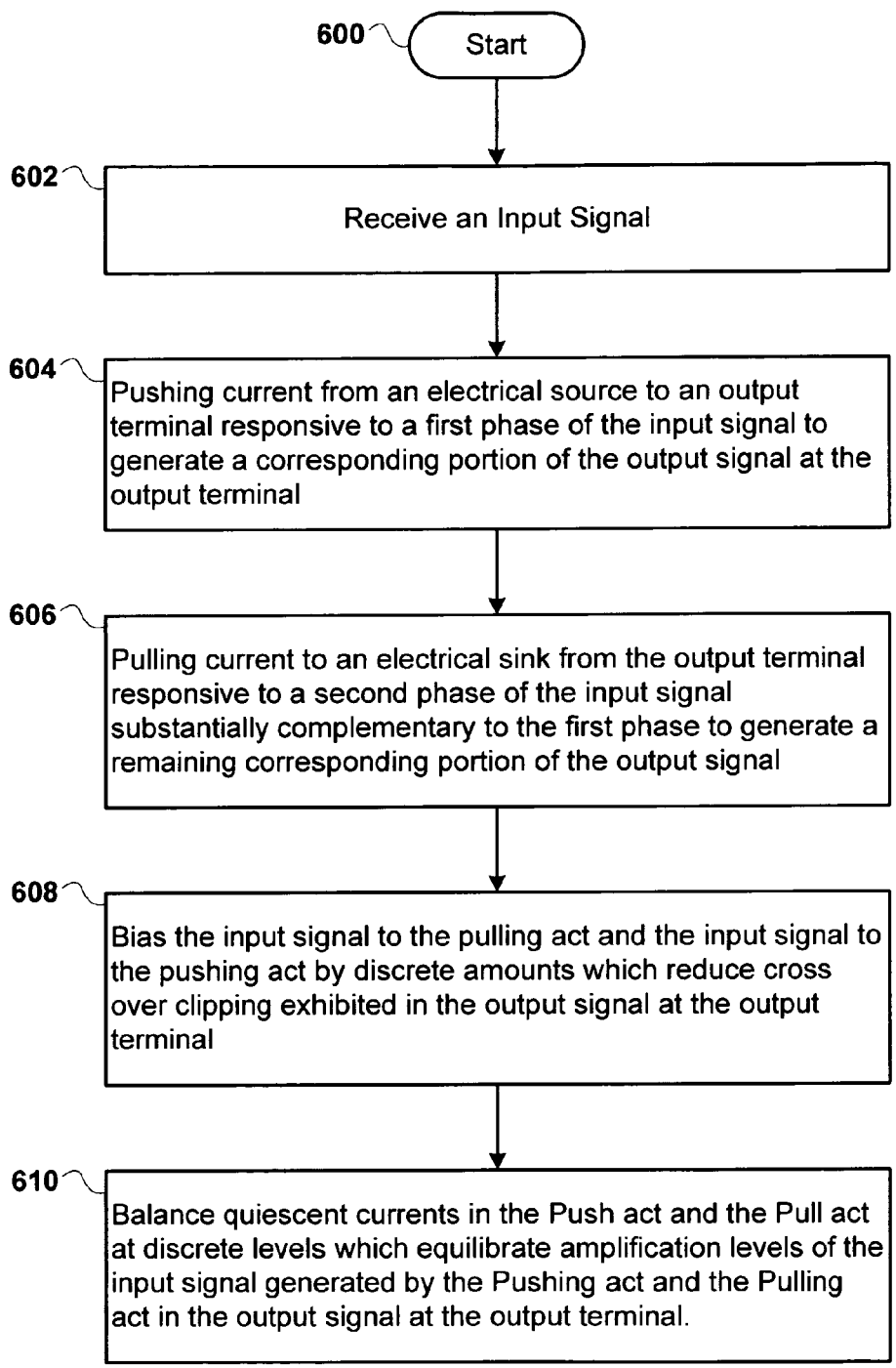
FIG. 6 is a process flow diagram of an embodiment of the quiescent current balanced push-pull amplifier of the current invention.

FIG. 6 is a process flow diagram of an embodiment of the quiescent current balanced push-pull amplifier of the current invention. After initialization in process 600 control passes to process 602 for receipt of the input signal. In process 604 current is pushed from an electrical source to an output terminal responsive to a first phase of the input signal to generate a corresponding portion of the output signal at the output terminal. In process 606 current is pulled to an electrical sink from the output terminal responsive to a second phase of the input signal substantially complementary to the first phase to generate a remaining corresponding portion of the output signal. In process 608 the input signal to the pulling and pushing acts is biased by discrete amounts which reduce cross-over clipping exhibited in the output signal at the output terminal. In process 610 quiescent currents in the pushing and pulling acts are balanced at discrete levels which equilibrate amplification levels of the input signal generated by the pushing act and the pulling act in the output signal at the output terminal.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An amplifier for amplifying an input signal from an input signal source, and the amplifier comprising:
   complementary push and pull components having control inputs coupled to the input signal source and channels serially coupled to one another between an electrical source and sink to generate an output signal at a common output terminal there between responsive to the input signal source;
   a bias component coupled between the input signal source and the control inputs of the complementary push-pull components to bias the input signal to the push component and the input signal to the pull component by discrete amounts which reduce cross-over clipping exhibited in the output signal at the output terminal; and
   a quiescent current balancer coupled to the complementary pull components exclusively at the common output terminal thereof and without any connection to the control inputs of the complementary push and pull components to balance quiescent currents in the push and the pull component at discrete levels which equilibrate amplification levels of the input signal generated by the push component and the pull component in the output signal at the common output terminal; thereby reducing distortion in output signal.

2. The amplifier of claim 1, wherein the quiescent current balancer further comprises:
   a high impedance electrical sink which removes a fixed amount of the quiescent current between the push component and the pull component at the output terminal thereby lowering quiescent current levels in the pull component relative to the push component by an amount which substantially equilibrates amplification levels of the input signal generated by the push component and the pull component in the output signal at the output terminal.

3. The amplifier of claim 1, wherein the quiescent current balancer further comprises:
   a high impedance electrical source which adds a fixed amount of current to the quiescent current between push component and the pull component at the output terminal thereby raising quiescent current levels in the pull component relative to the push component by an amount which substantially equilibrates amplification levels of the input signal generated by the push component and the pull component in the output signal at the output terminal.

4. The amplifier of claim 1, wherein the quiescent current balancer further comprises:
   a current mirror coupled to the output terminal and operative as a selected one of an electrical source and an electrical sink to adjust quiescent current levels in the push component and the pull component relative to one another by an amount which substantially equilibrates amplification levels of the input signal generated by the push component and the pull component in the output signal at the output terminal.

5. The amplifier of claim 1, wherein the complementary push and pull components further comprise:
   complementary "N" and "P" transistor types operating in anti-phase with one another responsive to the input signal to generate the output signal at the output terminal.

6. The amplifier of claim 1, wherein the complementary push and pull components further comprise:
   a push component having a pair of complementary "N" and "P" type bipolar transistors coupled in parallel between a voltage source and the output terminal to provide two stages of amplification of the input signal at the output terminal; and
   a pull component having a pair of complementary "P" and "N" type bipolar transistors coupled in parallel between the output terminal and a voltage sink and operating in anti-phase with respect to the push component to provide two stages of amplification of the input signal at the output terminal.

7. An amplifier for amplifying an input signal from an input signal source, and the amplifier comprising:
   complementary push and pull components serially coupled to one another between an electrical source and sink to generate an output signal at a common output terminal there between responsive to the input signal source;
   a bias component coupled between the input signal source and the complementary push-pull components to bias the input signal to the push component and the input signal to the pull component by discrete amounts which reduce cross-over clipping exhibited in the output signal at the output terminal;
   a quiescent current balancer coupled to the output terminal of the complementary push and pull components to balance quiescent currents in the push and the pull component at discrete levels which equilibrate amplification levels of the input signal generated by the push component and the pull component in the output signal at the output terminal; and the quiescent current balancer including:
   a programmable current mirror coupled to the output terminal and operative as a selected one of an electrical source and an electrical sink to adjust quiescent current levels in the push component and the pull component relative to one another by an amount which substantially equilibrates amplification levels of the input signal generated by the push component and the pull component in the output signal at the output terminal and the current mirror further responsive to a program signal to incrementally re-adjust quiescent current levels in the push component and the pull component in a direction which improves equilibration of the amplification levels of the input signal generated by the push component and the pull component in the output signal at the output terminal.

8. A method for amplifying an input signal from an input signal source, and the method comprising:
   pushing current from an electrical source to an output terminal responsive to a first phase of the input signal to generate a corresponding portion of the output signal at the output terminal;
   pulling current to an electrical sink from the output terminal responsive to a second phase of the input signal substantially complementary to the first phase to generate a remaining corresponding portion of the output signal at the output terminal;

biasing the input signal to the pulling act and the input signal to the pushing act by discrete amounts which reduce cross-over clipping exhibited in the output signal at the output terminal; and balancing quiescent currents exclusively at the output terminal at discrete levels which equilibrate amplification levels of the input signal generated by the pushing act and the pulling act in the output signal at the output terminal, thereby avoiding further biasing of the input signal biased in the biasing act and reducing distortion in the output signal.

9. The method for amplifying of claim 8 wherein the balancing act further comprises:

providing a current mirror coupled to the output terminal and operative as a selected one of an electrical source and an electrical sink to adjust quiescent current levels by an amount which substantially equilibrates amplification levels of the input signal generated by the pushing and pulling acts in the output signal at the output terminal.

10. The method for amplifying of claim 8 wherein the pushing and pulling acts further comprise:

providing a selected one of an "N" and a "P" type transistor to perform the pulling act; and providing a remaining unselected one of the "N" and "P" type transistor to perform the pushing act.

11. A method for amplifying an input signal from an input signal source, and the method comprising:

pushing current from an electrical source to an output terminal responsive to a first phase of the input signal to generate a corresponding portion of the output signal at the output terminal;

pulling current to an electrical sink from the output terminal responsive to a second phase of the input signal substantially complementary to the first phase to generate a remaining corresponding portion of the output signal;

biasing the input signal to the pulling act and the input signal to the pushing act by discrete amounts which reduce cross-over clipping exhibited in the output signal at the output terminal;

balancing quiescent currents in the pushing act and the pulling act at discrete levels which equilibrate amplification levels of the input signal generated by the pushing act and the pulling act in the output signal at the output terminal; and the balancing act further includes;

providing a programmable current mirror coupled to the output terminal and operative as a selected one of an electrical source and an electrical sink to adjust quiescent current levels in the pushing act and the pulling act relative to one another by an amount which substantially equilibrates amplification levels of the input signal generated by the pushing and pulling acts at the output terminal and the current mirror further responsive to a program signal to incrementally re-adjust quiescent current levels in the pushing and pulling acts in a direction which improves equilibration of the amplification levels of the input signal generated by the pushing and pulling acts in the output signal at the output terminal.

12. A means for amplifying an input signal from an input signal source, and the means comprising:

means for pushing current from a electrical source to an output terminal responsive to a first phase of the input signal to generate an output signal at the output terminal;

means for pulling current to an electrical sink from the output terminal responsive to a second phase of the input signal substantially complementary to the first phase to generate a remaining portion of the output signal at the output terminal;

means for biasing the input signal to the means for pulling and the input signal to the means for pushing by discrete amounts which reduce cross-over clipping exhibited in the output signal at the output terminal; and means for balancing quiescent currents exclusively at the output terminal at discrete levels which equilibrate amplification levels of the input signal generated by the pushing means and the pulling means in the output signal at the output terminal, thereby avoiding further biasing of the input signal biased by the biasing means and reducing distortion in the output signal.

13. The means for amplifying of claim 12 wherein the balancing means further comprises:

means for providing a current mirror coupled to the output terminal and operative as a selected one of an electrical source and an electrical sink to adjust quiescent current levels by an amount which substantially equilibrates amplification levels of the input signal generated by the pushing and pulling means in the output signal at the output terminal.

14. The means for amplifying of claim 12 wherein the pushing and pulling means further comprise:

means for providing a selected one of an "N" and a "P" type transistor to implement the pulling means; and means for providing a remaining unselected one of the "N" and "P" type transistor to implement the pushing means.

15. A means for amplifying an input signal from an input signal source, and the means comprising:

means for pushing current from a electrical source to an output terminal responsive to a first phase of the input signal to generate an output signal at the output terminal;

means for pulling current to an electrical sink from the output terminal responsive to a second phase of the input signal substantially complementary to the first phase to generate a remaining portion of the output signal;

means for biasing the input signal to the means for pulling and the input signal to the means for pushing by discrete amounts which reduce cross-over clipping exhibited in the output signal at the output terminal;

means for balancing quiescent currents in the pushing means and the pulling means at discrete levels which equilibrate amplification levels of the input signal generated by the pushing means and the pulling means in the output signal at the output terminal and wherein the balancing means further includes:

means for providing a programmable current mirror coupled to the output terminal and operative as a selected one of an electrical source and an electrical sink to adjust quiescent current levels in the pushing means and the pulling means relative to one another by an amount which substantially equilibrates amplification levels of the input signal generated by the pushing and pulling means at the output terminal and the current mirror further responsive to a program signal to incrementally re-adjust quiescent current levels in the pushing and pulling means in a direction which improves equilibration of the amplification levels of the input signal generated by the pushing and pulling means in the output signal at the output terminal.

* * * * *